(12) United States Patent
Shu

(10) Patent No.: US 9,679,894 B1
(45) Date of Patent: Jun. 13, 2017

(54) SEMICONDUCTOR VARIABLE RESISTOR AND SEMICONDUCTOR MANUFACTURING METHOD THEREOF

(71) Applicant: UNITED MICROELECTRONICS CORP., Hsinchu (TW)

(72) Inventor: Yu-Hsiang Shu, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/337,598

(22) Filed: Oct. 28, 2016

(30) Foreign Application Priority Data

Sep. 13, 2016 (TW) .............................. 105129792 A

(51) Int. Cl.
*H01L 27/07* (2006.01)
*H01L 29/78* (2006.01)
*H01L 29/66* (2006.01)

(52) U.S. Cl.
CPC .... *H01L 27/0738* (2013.01); *H01L 29/66492* (2013.01); *H01L 29/7833* (2013.01)

(58) Field of Classification Search
CPC ............... H01L 27/092; H01L 29/7613; H01L 21/823814; H01L 29/1033; H01L 29/7836; H01L 29/42376; H01L 29/7391; H01L 21/823807; H01L 29/775; H01L 29/0847; H01L 29/7833; H01L 21/26513; H01L 29/6659; H01L 29/122
See application file for complete search history.

(56) References Cited

U.S. PATENT DOCUMENTS

| 7,804,155 B2 * | 9/2010 | Chi ..................... H01L 27/0802 257/536 |
| 2005/0101092 A1 * | 5/2005 | Han .................. H01L 21/76232 438/296 |
| 2010/0237412 A1 * | 9/2010 | Shrivastava ........ H01L 29/0653 257/336 |

* cited by examiner

*Primary Examiner* — Roy Potter
(74) *Attorney, Agent, or Firm* — WPAT, PC

(57) ABSTRACT

A semiconductor variable resistance device includes: a substrate; a gate formed on the substrate, the substrate further including a first trench the first trench formed outside a side of the gate; first and second doped regions, formed in the substrate, the first and second doped regions formed on two sides of the gate, the first trench formed between the gate and the first doped region; and first and second lightly-doped drain (LDD) regions, formed in the substrate. The first LDD region is formed between the first trench and the first doped region. The second LDD region is formed between the gate and the second doped region. The first and second doped regions form a source and a drain, respectively. The first trench is deeper than the first and the second lightly-doped drain regions.

15 Claims, 6 Drawing Sheets

SEMICONDUCTOR VARIABLE RESISTOR AND SEMICONDUCTOR MANUFACTURING METHOD THEREOF

This application claims the benefit of Taiwan application Serial No. 105129792, filed Sep. 13, 2016, the subject matter of which is incorporated herein by reference.

BACKGROUND OF THE INVENTION

Field of the Invention

The invention relates in general to a semiconductor variable resistor device and a semiconductor method thereof.

Description of the Related Art

Semiconductor integrated circuit is getting more and more popular in people's everyday life. Electronic products such as mobile phones and PCs include a semiconductor integrated circuit.

Conventionally, if a semiconductor integrated circuit needs to use a variable resistor, the semiconductor integrated circuit is coupled to an external variable resistor through electrical pads, which is inconvenient.

Therefore, the present disclosure provides a semiconductor variable resistor device and a semiconductor method thereof to make the manufacturing process more convenient.

SUMMARY OF THE INVENTION

The present disclosure is directed to a semiconductor variable resistor device and a semiconductor method thereof. A semiconductor variable resistor device is formed in a semiconductor circuit, and the semiconductor method of the semiconductor variable resistor device is highly integrated.

According to an embodiment of the present disclosure, a semiconductor variable resistor device including a substrate, a gate, first and second doped regions, and first and second lightly doped drain regions is provided. The gate is formed on the substrate. The substrate further includes a first trench formed outside a side of the gate. The first and the second doped regions are formed inside the substrate but outside two sides of the gate. The first trench is formed between the gate and the first doped region. The first and the second lightly doped drain regions are formed inside the substrate. The first lightly doped drain region is formed between the first trench and the first doped region. The second lightly doped drain region is formed between the gate and the second doped region. The first and the second doped regions form a source and a drain, respectively. The first trench has a depth larger than respective depth of the first and the second lightly doped drain regions.

According to another embodiment of the present disclosure, a manufacturing method of a semiconductor variable resistor device is provided. The manufacturing method includes: forming a gate on a substrate; forming a first trench in the substrate, wherein the first trench is formed outside a side of the gate; forming a first lightly doped drain region and a second lightly doped drain region in the substrate, wherein the first and the second lightly doped drain regions are formed outside two sides of the gate, the first lightly doped drain region is formed outside a side of the first trench, and the first trench is formed between the gate and the first lightly doped drain region; and forming a first doped region and a second doped region in the substrate. The first lightly doped drain region is formed between the first trench and the first doped region, the second lightly doped drain region is formed between the gate and the second doped region, and the first and the second doped regions form a source and a drain respectively. The first trench has a depth larger than respective depth of the first and the second lightly doped drain regions.

The above and other contents of the invention will become better understood with regard to the following detailed description of the preferred but non-limiting embodiment(s). The following description is made with reference to the accompanying drawings.

DETAILED DESCRIPTION OF THE INVENTION

Technical terms are used in the specification with reference to generally-known terminologies used in the technology field. For any terms described or defined in the specification, the descriptions and definitions in the specification shall prevail. For any technologies and theories which are commonly seen in the technology field of the present disclosure but not involved with the technical features of the present disclosure, the similarities will not be repeated. Each embodiment of the present disclosure has one or more technical characteristics. Given that each embodiment is implementable, a person ordinarily skilled in the art can selectively implement or combine some or all of the technical characteristics of any embodiment of the present disclosure.

Figure 1A:
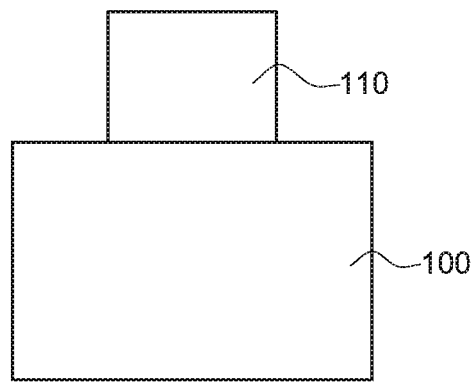
FIG. 1A to FIG. 1F are process diagrams of a manufacturing method for a semiconductor variable resistor device according to an embodiment of the present disclosure.

FIG. 1A to FIG. 1F are process diagrams of a manufacturing method for a semiconductor variable resistor device according to an embodiment of the present disclosure. As indicated in FIG. 1A, a gate 110 is formed on a substrate 100. In the present embodiment, the substrate 100 may be realized by such as a P-type substrate (P), and the gate 110 may be realized by such as a polycrystalline silicon gate.

Figure 1B:
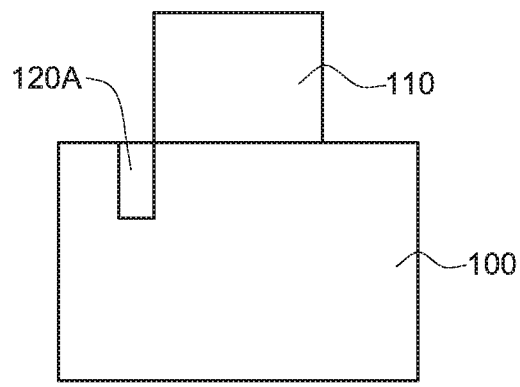
Figure 1C:
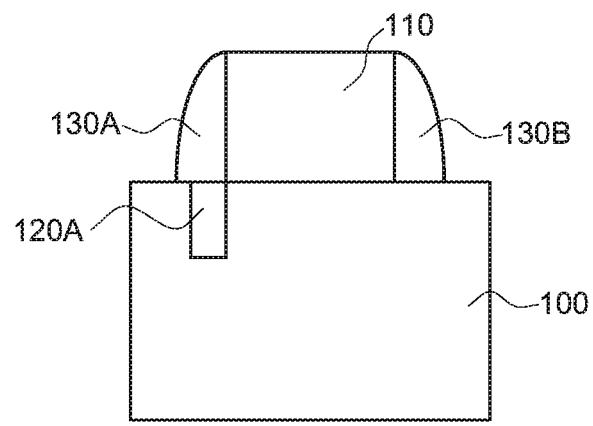

In FIG. 1B, exemplarily but not restrictively, a trench 120A is formed in the substrate 100 by an etching process. The position of the trench 120A is near the drain (not illustrated) or the source (not illustrated) but outside the gate 110. The depth of the trench 120A is described below.

In FIG. 10, spacers 130A and 130B are formed on two sides of the gate 110 respectively to cover the outside of the gate 110 (but not the top of the gate 110). The trench 120 may be formed under the spacer 130A.

Figure 1D:
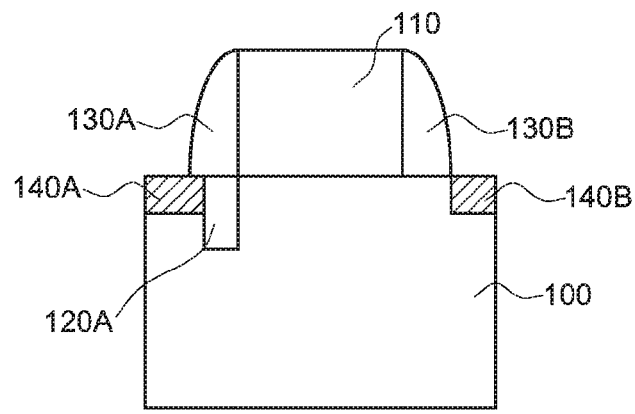

In FIG. 1D, inside the substrate 100, two lightly doped drain regions (LDD) 140A and 140B are formed on two sides of the gate 110. The lightly doped drain regions 140A and 140B may weaken the electrical field of the drain to improve the thermo-electron degradation effect. The trench 120A is formed between the lightly doped drain region 140A and the gate 110.

Figure 1E:
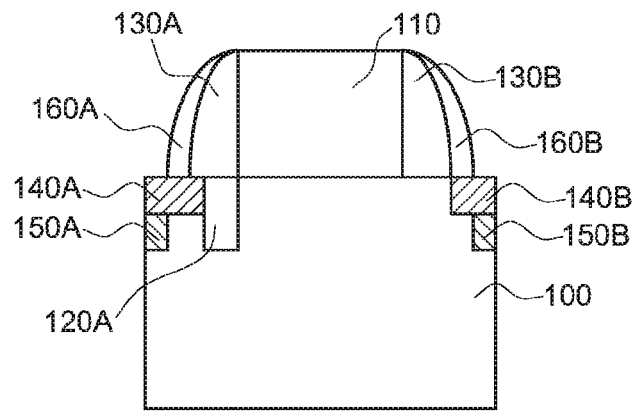

In FIG. 1E, two doped regions are formed on two sides of the gate 110 and used as source/drain regions 150A and 150B. The source/drain regions 150A and 150B are respectively formed under the lightly doped drain regions 140A and 140B. Additionally, two spacers 160A and 160B are respectively formed outside the two spacers 130A and 130B to cover the two spacers 130A and 130B. The source region 150A is formed outside a side of the trench 120A.

Figure 1F:
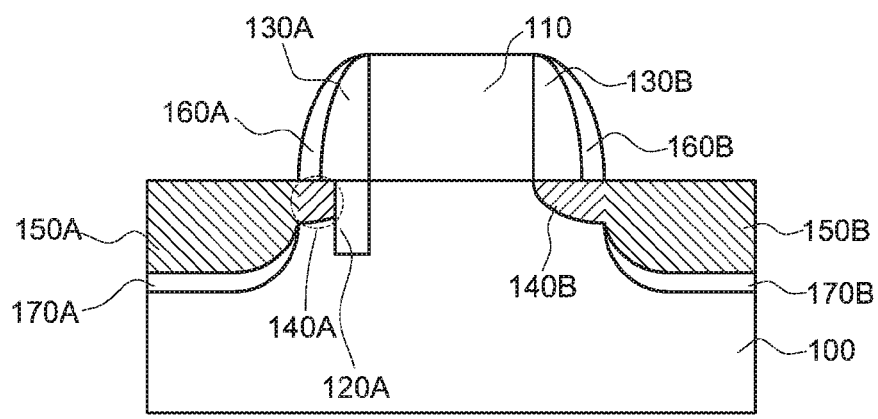

In FIG. 1F, the source/drain regions 150A and 150B, the diffusion regions 170A and 170B and the lightly doped drain regions 140A and 140B are formed on two sides of the gate 110 by an annealing process. As indicated in FIG. 1F, in an embodiment of the present disclosure, the trench 120A is deeper than the lightly doped drain region 140A but shallower than the source/drain region 150A. In the present embodiment, the trench 120A is formed between the gate 110 and the lightly doped drain region 140A; the lightly doped drain region 140A is formed between trench 120A and the source/drain region 150A, and the source/drain region 150A is formed outside the lightly doped drain region 140A. The source/drain region 150B is formed outside the lightly doped drain region 140B, and the lightly doped drain region 140B is formed between the gate 110 and the source/drain region 150B. The diffusion regions 170A and 170B is formed under the source/drain regions 150A and 150B.

Exemplarily but not restrictively, in the 8-inch manufacturing process, the depth of the trench 120A is between 400~500 Å, the lightly doped drain region 140A has a depth between 160~240 Å, and the source/drain region 150A has a depth between 1200~2400 Å. In the 12-inch 28 nm manufacturing process, the trench 120A has a depth between 80~120 Å, the lightly doped drain region 140A has a depth between 16~24 Å, and the source/drain region 150A has a depth between 1000~1800 Å. In the 12-inch 40 nm manufacturing process, the lightly doped drain region 140A has a depth between 18~22 Å. It should be understood that the above exemplifications are to be regarded as an illustrative sense rather than a restrictive sense, not for limiting the scope of protection of the present disclosure.

In an embodiment of the present disclosure, the trench 120A may be filled up with an insulating material.

Figure 2:
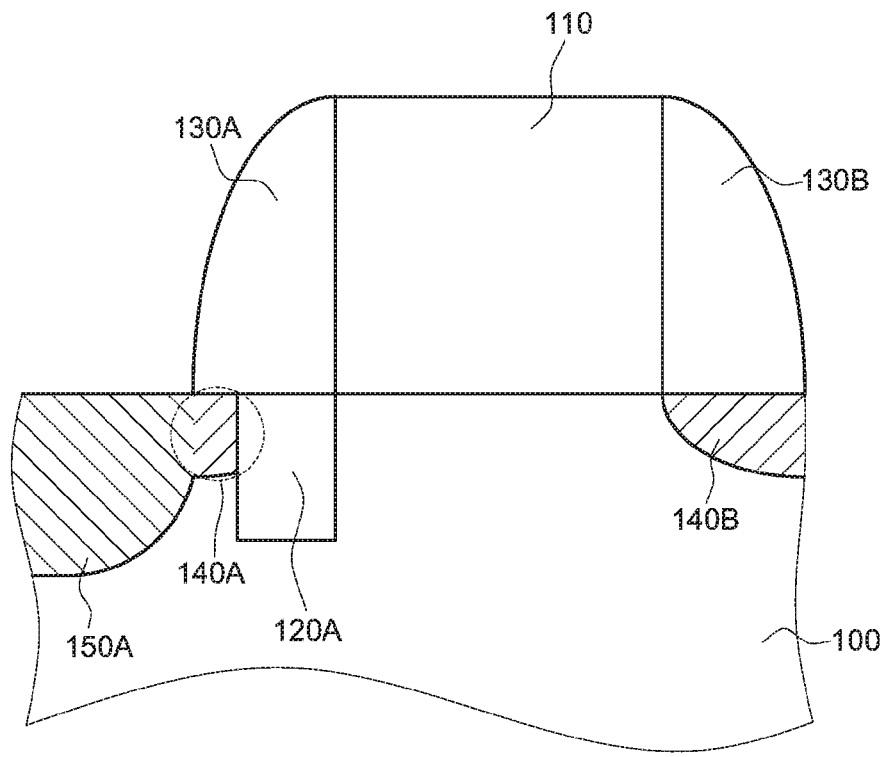
FIG. 2 is a partially enlarged view of a semiconductor variable resistor device according to an embodiment of the present disclosure.

FIG. 2 is a partially enlarged view of a semiconductor variable resistor device according to an embodiment of the present disclosure. As indicated in FIG. 2, the trench 120A has a depth larger than that of the lightly doped drain region 140A but smaller than that of the source/drain region 150A. To make it easier to understand, some structures (such as the spacers 160 and 160B) are not illustrated in FIG. 2.

Figure 3:
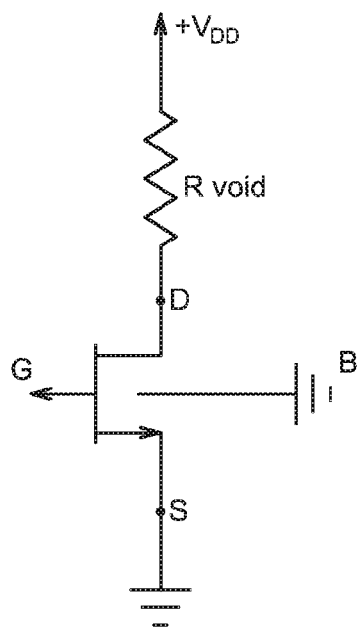
FIG. 3 is an equivalent circuit diagram of a semiconductor variable resistor device according to an embodiment of the present disclosure.

FIG. 3 is an equivalent circuit diagram of a semiconductor variable resistor device according to an embodiment of the present disclosure. As indicated in FIG. 3, "Rvoid" represents a variable resistor; the reference designations "G", "D", "S" and "B" respectively represent a gate, a drain, a source and a body; "+VDD" represents an operating voltage. In the present embodiment, the effective resistance of the semiconductor variable resistor device is controlled by adjusting voltages VDS and/or VGS.

Figure 4:
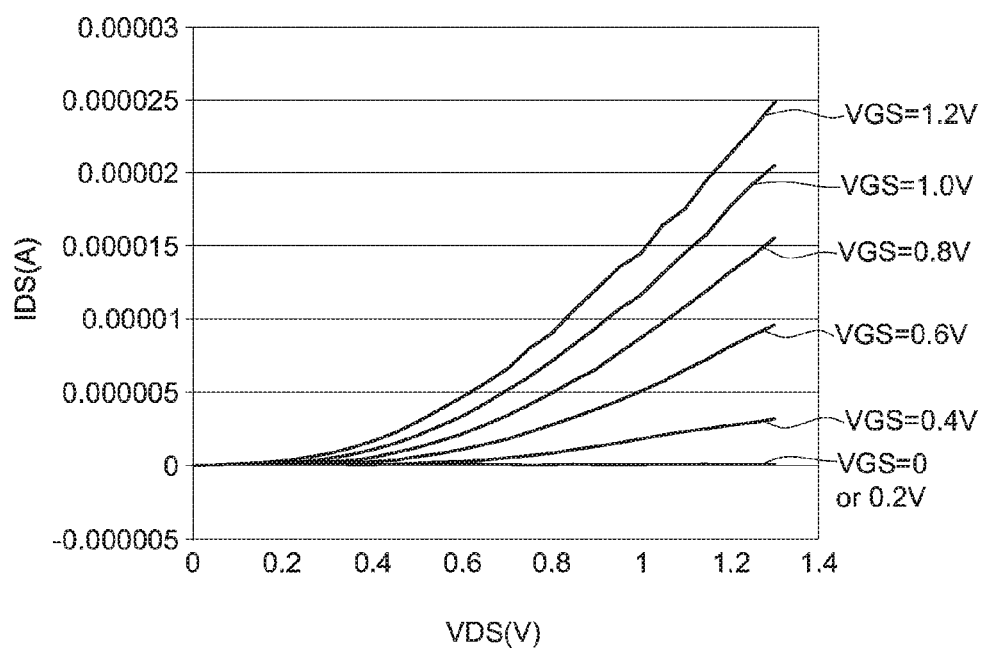
FIG. 4 is a voltage-current relationship diagram of a semiconductor variable resistor device according to an embodiment of the present disclosure.

FIG. 4 is a voltage-current (VDS, VGS and IDS) relationship diagram of a semiconductor variable resistor device according to an embodiment of the present disclosure. The current IDS represent a current flowing between the drain and the source. As indicated in FIG. 4, when the voltage VGS is equivalent to 0 or 0.2V, the current IDS is very small (near 0). That is, when the voltage VGS is equivalent to 0 or 0.2V, the resistance of the variable resistor is very high.

As indicated in FIG. 4, given that the voltage VDS remains the same, the current IDS rises as the voltage VGS rises. This implies that the effective resistance of the semiconductor variable resistor device may be controlled by adjusting the voltage VGS. Also, the effective resistance of the semiconductor variable resistor device may be controlled by adjusting the voltage VDS. That is, the effective resistance of the semiconductor variable resistor device may be controlled by adjusting the gate voltage and/or the drain voltage.

The range of the effective resistance of the semiconductor variable resistor device according to an embodiment of the present disclosure is listed below:

|  | VDS = 0.6 V | VDS = 1.2 V |
| --- | --- | --- |
| VGS = 1.2 V | 120k ohms | 56k ohms |
| VGS = 0.4 V | 544k ohms | 147k ohms |

The above table shows that the range of the effective resistance of the semiconductor variable resistor device according to an embodiment of the present disclosure is between 56~544 k ohms.

Exemplarily but not restrictively, the operating range of the voltage VDS according to an embodiment of the present disclosure is between 0.2~1.2 times of the operating voltage, and the operating range of the voltage VGS is between 0.4~1.2 times of the operating voltage.

Figure 5:
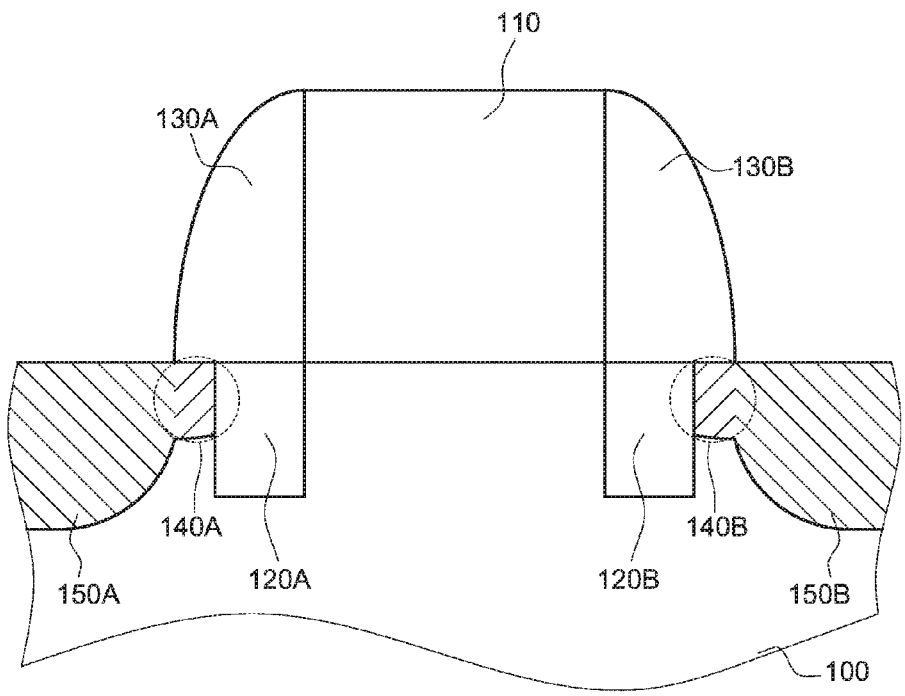
FIG. 5 is a partially enlarged view of a semiconductor variable resistor device according to another embodiment of the present disclosure.

In other possible embodiments of the present disclosure, a second trench 120B may be formed in the substrate 100 as indicated in FIG. 5. The second trench 120B is formed near the drain (not illustrated) or the source (not illustrated). The trenches 120A and 120B are formed on two sides of the gate 110. Similarly, the second trench 120B is formed between the gate 110 and the lightly doped drain region 140B, and the lightly doped drain region 140B is formed between the second trench 120B and the source/drain region 150B.

In other possible embodiment of the present disclosure, the effective resistance of the semiconductor variable resistor device having two trenches 120A and 120B in the substrate 100 will be higher (or far higher) than that of the semiconductor variable resistor device having one single trench 120A in the substrate 100. Exemplarily but not restrictively, the effective resistance of the semiconductor variable resistor device having two trenches 120A and 120B in the substrate 100 may be as high as several M ohms.

FIG. 5 is a partially enlarged view of a semiconductor variable resistor device according to another embodiment of the present disclosure. As indicated in FIG. 5, a second trench 120B is formed in the substrate 100 of a semiconductor variable resistor device. Similarly, the second trench 120B has a depth larger than that of the lightly doped drain region 140A/140B but smaller than that of the source/drain region 150A/150B. Basically, the depth of the second trench 120B may be equivalent to that of the trench 120A of FIG. 2. To make it easier to understand, some structures (such as the spacers 160 and 160B) are not illustrated in FIG. 5.

Figure 6:
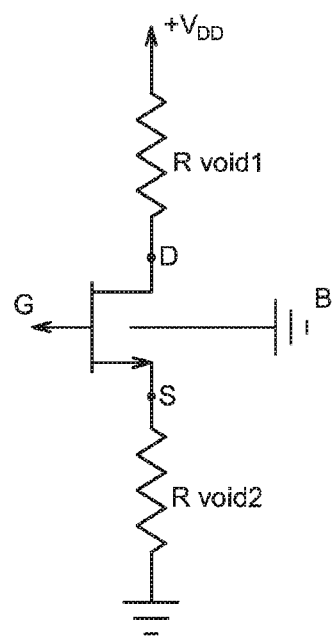
FIG. 6 is an equivalent circuit diagram of a semiconductor variable resistor device according to an embodiment the present disclosure illustrated in FIG. 5.

FIG. 6 is an equivalent circuit diagram of a semiconductor variable resistor device according to an embodiment the present disclosure illustrated in FIG. 5. As indicated in FIG. 6, "Rvoid1" and "Rvoid2" respectively represent a variable resistor. In the embodiment of the present disclosure illustrated in FIG. 6, the effective resistance of the variable resistors Rvoid1 and/or Rvoid2 of the semiconductor variable resistor device may be controlled by adjusting the voltages VDS and/or VGS.

Figure 7:
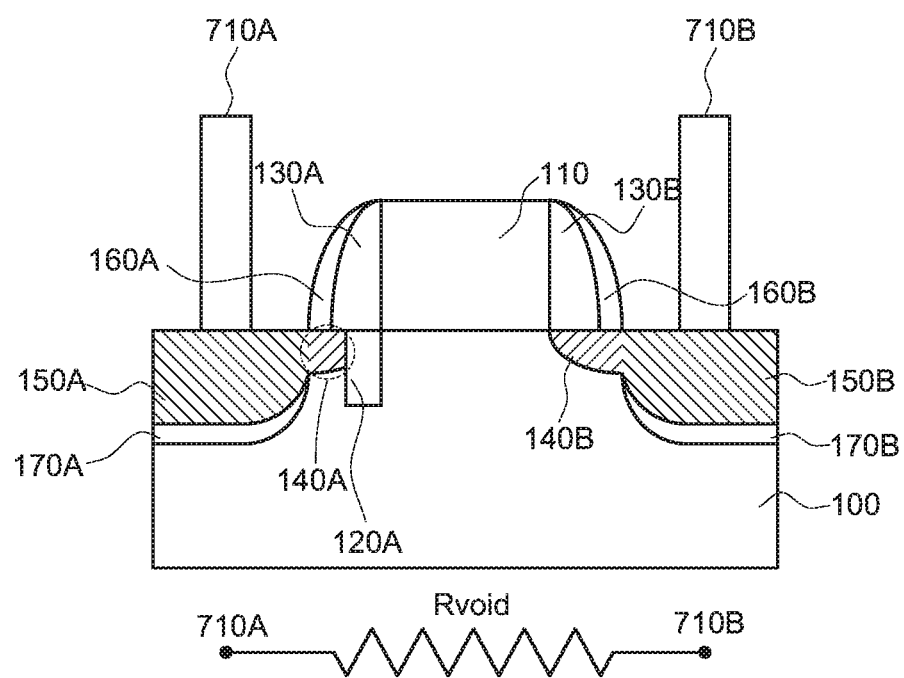
FIG. 7 is a schematic diagram of two ends of a variable resistor of a semiconductor variable resistor device according to an embodiment of the present disclosure.

FIG. 7 is a schematic diagram of two ends of a variable resistor of a semiconductor variable resistor device according to an embodiment of the present disclosure. As indicated in FIG. 7, the semiconductor variable resistor device further includes two contacts 710A and 710B formed outside the spacers 160A and 160B and disposed on the source/drain regions 150A and 150B. The contacts 710A and 710B are electrically connected to the source/drain regions 150A and 150B to receive a source voltage and a drain voltage, respectively. The contacts 710A and 710B are used as two ends of the variable resistor Rvoid (or Rvoid1 or Rvoid2).

Although it is not illustrated in the diagram, another contact may be formed on the gate 110 to receive a gate voltage. That is, an equivalent resistance of the variable resistor may be controlled by adjusting a gate voltage applied to the gate 110, a drain voltage applied to the drain, and/or a source voltage applied to the source.

In an embodiment of the present disclosure, a transistor having a trench is formed and used as a variable resistor device rather than a switch. The resistance of the semiconductor variable resistor device may be controlled by adjusting the gate-drain voltage and/or the gate-source voltage. Two ends of the semiconductor variable resistor device are the drain and the source respectively (as indicated in FIG. 3).

The semiconductor process of a semiconductor variable resistor device according to an embodiment of the present disclosure may be integrated in the semiconductor process of MOS transistor (used as a switch). According to the current technology, the semiconductor circuit is connected to an external variable resistor through electrical pads. However, in the semiconductor process according to the embodiment of the present disclosure, in order to form a semiconductor variable resistor device on a semiconductor circuit, the semiconductor variable resistor device may be integrated in the semiconductor circuit.

Besides, the critical dimension (CD) of the semiconductor variable resistor device according to an embodiment of the present disclosure may be the same as that of an ordinary MOS transistor. Here, CD may refer to a gate width. Moreover, the doping concentration of the semiconductor variable resistor device according to the embodiment of the present disclosure may be the same as that of an ordinary MOS transistor. That is, the manufacturing process of the semiconductor variable resistor device according to an embodiment of the present disclosure is highly compatible with the existing CMOS transistor manufacturing process.

In terms of the manufacturing process, if an ordinary MOS transistor is formed using the manufacturing process according to an embodiment of the present disclosure, after the step illustrated FIG. 1A is completed, in the step illustrated FIG. 1B, the substrate 100 is covered by a photoresist to avoid forming a trench 120A inside the substrate 100. Then, the manufacturing process continues with the steps illustrated in FIG. 10 to FIG. 1F. Thus, an ordinary MOS transistor (which may be used as a switch) is formed.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor variable resistor device, comprising:
a substrate;
a gate formed on the substrate, wherein the substrate further comprises a first trench formed outside a side of the gate;
a first doped region and a second doped region formed in the substrate, the first doped region and the second doped region formed outside two sides of the gate, wherein the first trench is formed between the gate and the first doped region; and
a first lightly doped drain region and a second lightly doped drain region formed in the substrate, wherein the first lightly doped drain region is formed between the first trench and the first doped region, and the second lightly doped drain region is formed between the gate and the second doped region,
wherein,
the first and the second doped regions form a source and a drain respectively, and
the first trench has a depth larger than respective depth of the first and the second lightly doped drain regions.

2. The semiconductor variable resistor device as claimed in claim 1, further comprising:
a first contact formed on the gate;
a second contact formed on the source; and
a third contact formed on the drain,
wherein the second contact and the third contact are used as two ends of a variable resistor of the semiconductor variable resistor device.

3. The semiconductor variable resistor device as claimed in claim 2, wherein, an equivalent resistance of the variable resistor is controlled by adjusting a voltage applied between the gate and the source.

4. The semiconductor variable resistor device as claimed in claim 1, wherein, the first trench has a depth smaller than respective depth of the first and the second doped regions.

5. The semiconductor variable resistor device as claimed in claim 4, wherein,
the substrate further comprises a second trench formed between the gate and the second lightly doped drain region,
the second lightly doped drain region is formed between the second trench and the second doped region,
the first and the second trenches are formed on two sides of the gate, and
the second trench has a depth smaller than respective depth of the first and the second doped regions but larger than respective depth of the first and the second lightly doped drain regions.

6. The semiconductor variable resistor device as claimed in claim 1, wherein,
an operating range of a voltage applied between the drain and the source is 0.2~1.2 times of an operating voltage; and
an operating range of a voltage applied between the gate and the source is 0.4~1.2 times of the operating voltage.

7. The semiconductor variable resistor device as claimed in claim 1, wherein,
the depth of the first trench is between 400~500 Å,
respective depth of the first and the second lightly doped drain regions are between 160~240 Å, and
respective depth of the first and the second doped regions are between 1200~2400 Å.

8. The semiconductor variable resistor device as claimed in claim 1, wherein,
the depth of the first trench is between 80~120 Å,
respective depth of the first and the second lightly doped drain regions are between 16~24 Å, and
respective depth of the first and the second doped regions are between 1000~1800 Å.

9. A manufacturing method of a semiconductor variable resistor device, the manufacturing method comprising:
forming a gate on a substrate;
forming a first trench in the substrate, wherein the first trench is formed outside a side of the gate;
forming a first lightly doped drain region and a second lightly doped drain region in the substrate, wherein the first and the second lightly doped drain regions are formed outside two sides of the gate, the first lightly doped drain region is formed outside a side of the first trench, and the first trench is formed between the gate and the first lightly doped drain region; and
forming a first doped region and a second doped region in the substrate, wherein the first lightly doped drain region is formed between the first trench and the first doped region, the second lightly doped drain region is formed between the gate and the second doped region, and the first and the second doped regions form a source and a drain respectively,
wherein, the first trench has a depth larger than respective depth of the first and the second lightly doped drain regions.

10. The manufacturing method as claimed in claim 9, further comprising:
forming a first contact on the gate;
forming a second contact on the source; and
forming a third contact on the drain,
wherein the second contact and the third contact are used as two ends of a variable resistor of the semiconductor variable resistor device.

11. The manufacturing method as claimed in claim 10, wherein, an equivalent resistance of the variable resistor is controlled by adjusting a voltage applied between the gate and the source.

12. The manufacturing method as claimed in claim 11, wherein, the first trench has a depth smaller than respective depth of the first and the second doped regions.

13. The manufacturing method as claimed in claim 12, further comprising:
forming a second trench inside the substrate,
wherein the second trench is formed between the gate and the second lightly doped drain region,
the second lightly doped drain region is formed between the second trench and the second doped region,
the first and the second trenches are formed on the gate, and
the second trench has a depth smaller than respective depth of the first and the second doped regions but larger than respective depth of the first and the second lightly doped drain regions.

14. The manufacturing method as claimed in claim 11, wherein,
the depth of the first trench is between 400~500 Å,
respective depth of the first and the second lightly doped drain regions are between 160~240 Å, and
respective depth of the first and the second doped regions are between 1200~2400 Å.

15. The manufacturing method as claimed in claim 11, wherein,
the depth of the first trench is between 80~120 Å,
respective depth of the first and the second lightly doped drain regions are between 16~24 Å, and
respective depth of the first and the second doped regions are between 1000~1800 Å.

* * * * *